United States Patent
Smith et al.

(10) Patent No.: US 11,339,948 B2
(45) Date of Patent: *May 24, 2022

(54) LIGHT-EMITTING DEVICE AND LUMINAIRE INCORPORATING SAME

(71) Applicant: Quarkstar LLC, Las Vegas, NV (US)

(72) Inventors: George E. Smith, Sunnyvale, CA (US); Robert C. Gardner, Atherton, CA (US)

(73) Assignee: Quarkstar LLC, Las Vegas, NV (US)

(*) Notice: Subject to any disclaimer, the term of this patent is extended or adjusted under 35 U.S.C. 154(b) by 0 days.

This patent is subject to a terminal disclaimer.

(21) Appl. No.: 16/889,384

(22) Filed: Jun. 1, 2020

(65) Prior Publication Data
US 2021/0088200 A1 Mar. 25, 2021

Related U.S. Application Data

(63) Continuation of application No. 16/167,282, filed on Oct. 22, 2018, now Pat. No. 10,670,226, which is a
(Continued)

(51) Int. Cl.
*F21V 5/04* (2006.01)
*H01L 33/58* (2010.01)
(Continued)

(52) U.S. Cl.
CPC .............. *F21V 5/041* (2013.01); *F21V 5/046* (2013.01); *F21V 7/0091* (2013.01); *F21V 7/041* (2013.01);
(Continued)

(58) Field of Classification Search
CPC . F21V 5/041; F21V 5/046; F21V 7/30; F21V 7/0091; F21V 7/041; H01L 33/58; H01L 33/60
See application file for complete search history.

(56) References Cited

U.S. PATENT DOCUMENTS 3,596,136 A 7/1971 Fischer
4,301,461 A 11/1981 Asano
(Continued)

FOREIGN PATENT DOCUMENTS

WO WO0127962 4/2001
WO WO2013078463 5/2013

OTHER PUBLICATIONS

H. Ries and R. Winston, "Tailored edge-ray reflectors for illumination." J. Opt. Soc. Am. A, vol. 11, No. 4, Apr. 1994, pp. 1260-1264.
(Continued)

*Primary Examiner* — Mary Ellen Bowman
(74) *Attorney, Agent, or Firm* — Fish & Richardson P.C.

(57) ABSTRACT

A light-emitting device includes a lens of refractive index n having a spherical exit surface of radius R and a luminous element positioned such that at least a portion of an edge of an emitting surface of the luminous element lies on a sphere of radius R/n opposite the exit surface, whereby that portion of the edge of the emitting surface is aplanatically imaged by the spherical exit surface. The light-emitting device may further include one or more reflective sidewalls arranged to reflect a fraction of light emitted from the luminous element before it is refracted by the exit surface. A luminaire incorporating a housing and a light-emitting device of this type is also provided, which may include one or more additional optical elements such as reflectors or lenses to further direct and shape light from the light-emitting device.

15 Claims, 14 Drawing Sheets

Related U.S. Application Data continuation of application No. 14/917,923, filed as application No. PCT/US2013/059545 on Sep. 12, 2013, now Pat. No. 10,107,475.

(51) Int. Cl.
    *F21V 7/30*     (2018.01)
    *F21V 7/00*     (2006.01)
    *F21V 7/04*     (2006.01)
    *H01L 33/60*     (2010.01)

(52) U.S. Cl.
    CPC ............ *F21V 7/30* (2018.02); *H01L 33/58* (2013.01); *H01L 33/60* (2013.01)

(56) References Cited

U.S. PATENT DOCUMENTS

| | | | |
|---|---|---|---|
| 4,907,044 A | 3/1990 | Schellhorn | |
| 5,055,892 A * | 10/1991 | Gardner | H01L 33/58 |
| | | | 257/99 |
| 5,282,088 A * | 1/1994 | Davidson | G02B 3/00 |
| | | | 359/642 |
| 7,798,678 B2 | 9/2010 | Destain | |
| 2006/0255353 A1 | 11/2006 | Taskar et al. | |
| 2008/0101754 A1 | 5/2008 | Parker et al. | |
| 2010/0073927 A1 | 3/2010 | Lewin et al. | |
| 2013/0021776 A1 | 1/2013 | Veerasamy et al. | |
| 2013/0201715 A1 | 8/2013 | Dau et al. | |

OTHER PUBLICATIONS

J. Miñano and J. Gonzalez, "New method of design of nonimaging concentrators," Appl. Opt. vol. 31, No. 16, Jun. 1, 1992, pp. 3051-3060.

X. Ning, R. Winston and J. O'Gallagher, "Dielectric totally internally reflecting concentrators," Appl. Opt. vol. 26, No. 2 , Jan. 15, 1987, pp. 300-305.

Notification of Transmittal of the International Search Report and the Written Opinion of the International Searching Authority, International Application No. PCT/US2013/059545, dated Feb. 14, 2014, 15 pages.

* cited by examiner

LIGHT-EMITTING DEVICE AND LUMINAIRE INCORPORATING SAME

CROSS-REFERENCE TO RELATED APPLICATIONS

This application is a continuation of and claims priority to U.S. patent application Ser. No. 16/167,282, filed on Oct. 22, 2018, which is a continuation of and claims priority to U.S. patent application Ser. No. 14/917,923, filed on Mar. 9, 2016, which is a U.S. National Stage of International Application No. PCT/US2013/059545, filed Sep. 12, 2013, incorporated by reference herein.

BACKGROUND

1. Field of the Invention

The present invention relates to light sources for illumination, and more particularly to light-emitting devices and luminaires having refracting and reflecting surfaces to alter the distribution of light from a luminous element.

2. Description of the Related Art

Light-emitting elements (LEEs) are ubiquitous in the modern world, being used in applications ranging from general illumination (e.g., light bulbs) to lighting electronic information displays (e.g., backlights and front-lights for LCDs) to medical devices and therapeutics. Solid state lighting (SSL) devices, which include light-emitting diodes (LEDs), are increasingly being adopted in a variety of fields, promising low power consumption, high luminous efficacy and longevity, particularly in comparison to incandescent and other conventional light sources. A luminaire is a lighting unit that provides means to hold, position, protect, and/or connect one or more light-emitting elements to an electrical power source, and in some cases to distribute the light emitted by the LEEs.

One example of a LEE increasingly being used for in luminaires is a so-called "white LED." Conventional white LEDs typically include a "pump" LED that emits blue or ultraviolet light, and a phosphor or other luminescent material. The device generates white light via down-conversion by the phosphor of a fraction of the blue or UV light from the LED (referred to as "pump light") to light of a red, yellow, or green wavelength, or a combination of wavelengths longer than that of the pump light, and the mixing of light having these various wavelengths from the pump and phosphor. Such white LED devices are also referred to as phosphor-converted LEDs (pcLEDs). Although subject to some losses due to the light conversion, various aspects of pcLEDs promise reduced complexity, better cost efficiency and durability of pcLED-based luminaires in comparison to other types of luminaires. In conventional pcLEDs, a phosphor is often coated directly onto the semiconductor die of the pump LED or suspended within an encapsulant very close to the semiconductor die within the LED die package. In this position, the phosphor is subjected to the high operating temperature of the semiconductor die, and it is difficult to design and fabricate a die package with excellent angular color uniformity.

Recently, light sources have been introduced in which a phosphor is coated onto, or suspended within, a larger substrate that is separated spatially somewhat from the LED die package instead of incorporating it close to the die. Such a configuration may be referred to as a "remote phosphor." Increasing the separation of the phosphor from the pump LED provides many potential benefits including better color control, higher system efficiency and luminous efficacy, lower operating temperature—leading to higher reliability (lumen maintenance) and color stability, design freedom to shape the emitting surface, and lower glare from a larger emitting surface. The remote phosphor approach is driving rapid advancement in high-power and high-efficiency solid-state light sources for general lighting. Together with the improvements in luminous efficacy that are associated with the LED light sources themselves, there is also a push for improved optics to direct the light where it is needed with high efficiency, which is another component of energy efficiency.

Large-area remote phosphor elements, often packaged together, e.g., with arrays of pump LEDs placed in so-called "mixing chambers," behave as Lambertian emitting surfaces that are good for wide-angle ambient lighting when placed in simple luminaires having little or no secondary optics (i.e., optics outside of the LED package) for shaping the light distribution. But compared to the more point-like earlier-generation white LEDs, it is more difficult to design and manufacture efficient optics to tailor the light distribution from these extended-source luminous elements, especially for applications needing narrower beam patterns or steep cutoff at the beam edges. Certain conventional approaches to making narrower or steeper patterns result in unwanted losses in efficiency, as some light from the luminous elements is blocked rather than redirected into the desired beam pattern. Similarly, using conventional imaging optics to generate image-forming designs, even by experienced practitioners, generally results in systems of large size and having significantly less than the maximum possible optical efficiency. Currently, a relatively small proportion of designers are well versed in the young specialty of nonimaging optics, which, as the relevant discipline for light-emitting devices and luminaires for illumination, rigorously analyzes and enables designs achieving the maximum thermodynamic limits for efficiency. In addition, much of the nonimaging optics theoretical literature is related to light-collecting concentrators rather than to light-emitting devices. Design of optics for LEDs and luminaires thus lags somewhat behind the rapid advancements in high-power LED light sources themselves.

There is accordingly an ongoing need for novel light-emitting devices and luminaires designed to operate efficiently in conjunction with Lambertian extended sources such as those using remote phosphor luminous elements, using simple to fabricate refractive and/or reflective surfaces, and with the ability to tailor the far-field patterns to have useful profiles for a variety of general lighting applications.

SUMMARY

Accordingly, the present technology provides light-emitting devices and luminaires having lenses of refractive index n with spherical refractive exit surfaces and that are designed to operate efficiently in conjunction with extended source luminous elements having, in some embodiments, a disk shape. This is accomplished by positioning the edge of the emitting surface of the luminous element on a notional sphere of radius $R/n$ opposite the exit surface (or radius $Rn_0/n$ if the device is emitting into a medium of index $n_0$), so that at least a portion of the edge of the emitting surface is aplanatically imaged by the spherical exit surface. Aplanatic "sharp" imaging results in a well-controlled angular distribution of those edge rays that are directly incident on the exit surface and transmitted into the medium by the spherical surface with little or no primary aberrations. The primary monochromatic aberrations of spherical aberration and coma, as well as astigmatism, tend to broaden and blur the edges of the far-field angular distribution of the transmitted edge rays for a spherical lens operated away from this aplanatic condition, which may be detrimental to the far-field beam pattern, especially for applications needing narrower beam patterns or steep cutoff at the beam edges. Thus, unless appropriately controlled, aberrations could reduce the efficiency of the light-emitting device with regard to the proportion of emitted light that falls within a desired beam pattern.

In some embodiments, one or more reflective sidewalls are provided as part of the lens, or as one or more separate pieces, to redirect light rays that emerge from the luminous element at higher divergence angles from the optical axis. These reflective sidewalls or other reflectors can be used alone or in combination to further direct and shape the light emerging from the light-emitting device, for example to make narrow far-field beam patterns or steep cutoff at the beam edges. Reflective sidewalls can operate, e.g., by total internal reflection (TIR), or use reflective coatings directly on the lens, or comprise a separate reflector adjacent the lens sidewall. Reflective sidewalls can be configured so that there is a maximum of one reflection before a ray is incident on the exit surface, which can help provide good optical efficiency. Reflective sidewalls can be conical, or shaped to ensure TIR, e.g., using an equiangular spiral shape for at least a portion of the sidewall, or can include two or more differently-shaped portions or facets. In addition, one or more separate reflectors can redirect light escaping the sidewall back into the lens to improve efficiency, or if positioned or extended beyond the exit surface, they can be used to redirect and/or shape some of the light leaving the refractive exit surface at higher divergence angles, or both.

In some embodiments, a luminaire is provided that includes a housing supporting a light-emitting device. A luminaire can further include an optical element to further direct and shape or filter the light from the light-emitting device, where the optical element can be a reflector, lens, filter, diffuser, or other optical element.

Embodiments of light-emitting devices may exhibit high efficiency without the use of special coatings on the spherical exit surface, by geometrically arranging for all rays emitted by the luminous element to be incident upon the exit surface at less than the critical angle for TIR. In those embodiments using a reflective sidewall, for example, internal reflection losses can be further reduced by arranging for all rays to be incident on the exit surface at angles that do not exceed an even smaller angle than the critical angle, such as the Brewster angle.

More specifically, in certain embodiments, a light-emitting device has an optical axis, which radiates light into a medium of refractive index $n_0$. The light-emitting device has a lens of refractive index n with a convex spherical exit surface of radius R centered on the optical axis, and a luminous element having an emitting surface that is optically coupled to, and emits light into, the lens. The luminous element is positioned such that at least a portion of an edge of the emitting surface lies approximately (e.g., within reasonable manufacturing tolerance) on a notional sphere of radius $Rn_0/n$ having the same center of curvature as the lens, with the emitting surface approximately centered on the optical axis opposite the exit surface across the center of curvature, whereby that portion of the edge of the emitting surface is substantially aplanatically imaged by the spherical exit surface of the lens.

Certain embodiments feature a luminaire with a housing and a light-emitting device supported by the housing. The light-emitting device, which has an optical axis and emits into a medium of refractive index $n_0$, has a lens of refractive index n with a convex spherical exit surface of radius R with the center of curvature disposed along the optical axis, and a luminous element. The luminous element has an emitting surface optically coupled to, and emitting light into, the lens, and is positioned such that at least a portion of an edge of the emitting surface lies approximately on a notional sphere of radius $Rn_0/n$ having the same center of curvature as the lens. The emitting surface is approximately centered on the optical axis opposite the exit surface across the center of curvature, whereby that portion of the edge of the emitting surface is substantially aplanatically imaged by the spherical exit surface of the lens.

Other features and advantages will be apparent to those of ordinary skill in the art upon reference to the following detailed description taken in conjunction with the accompanying drawings.

DETAILED DESCRIPTION OF THE INVENTION

While the configuration and performance of various embodiments are discussed in detail below, it should be appreciated that the concepts described can be embodied in a wide variety of specific contexts. The specific embodiments discussed herein are thus merely illustrative of specific ways to make and use the invention and are not intended to delimit the scope of the invention.

Nonimaging optical design depends primarily on the edge ray principle (W. Welford and R. Winston, The Optics of Nonimaging Concentrators, New York: Academic Press, 1978) to design optical systems having high optical efficiency. According to the edge ray principle, an ideal system (having maximum theoretical concentration and efficiency) transmitting radiation from an entry aperture to an exit aperture has the property that extreme rays of the entry aperture pass the exit aperture likewise as extreme rays. All other rays originating within the entry aperture traverse the system to lie at angles and/or positions within those of the extreme rays, and are thus also transmitted without loss. The edge ray principle was originally developed to describe reflecting optical systems, but has since been generalized to include refractive systems. Similarly, although nonimaging optics was originally formulated for application to concentrating systems, in which light incident on an optical system over a range of angles is concentrated to a smaller area (over a larger range of angles), it has since been applied to illumination systems in which light from a light source emitting over a range of angles is "collimated" by an optical system to emerge from a larger aperture over a smaller range of angles. The edge-ray design principle as applied to light sources can be formulated as follows: rays originating at an edge point of the extended light source should propagate at the maximum divergence angle of the output beam after leaving the collimator. Rays originating at points within the edge of the light source should all emerge at angles within the maximum divergence angle. Satisfying this condition leads to well-formed far-field patterns with desirable edge steepness (light remaining within a designed maximum divergence angle).

Figure 1:
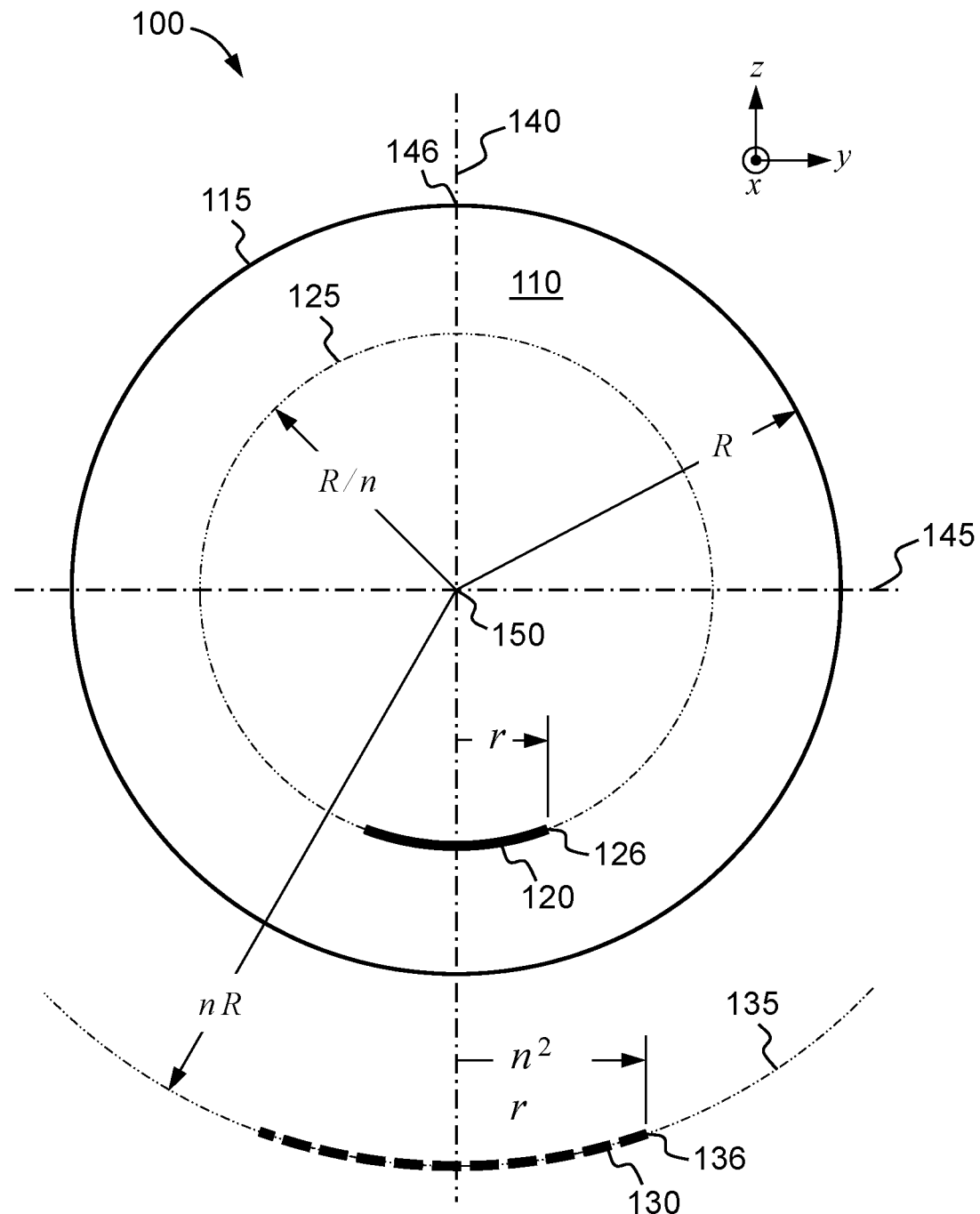
FIG. 1 is a cross-sectional view of a light-emitting device having a spherical exit surface.

Referring now to FIG. 1, a cross-sectional view of an embodiment of a light-emitting device 100 is shown for the purpose of discussing the principles of operation and fundamental geometry. Light-emitting device 100 is designed to emit light generally in the positive-z direction; the terms "front" versus "back" (or "rear"), or "forward" versus "backward," will be used to refer to the directions, or parts located toward, positive-z versus negative-z, respectively. A spherical lens 110 of radius R, including an optical material that is transparent to wavelengths of interest, has a center of curvature 150 at the intersection of an optical axis 140 that is parallel to the z axis as shown by the coordinate system at the upper right of the figure and an equatorial plane 145 that is parallel to the x-y plane. The equatorial plane 145 is the plane that is normal to the optical axis 140 and that includes the center of curvature 150. (In the interest of clarity and to reduce clutter, FIG. 1 and other similar views shown herein omit cross-hatching that would normally indicate the transparent material of the lens in cross-sectional drawings.) Lens 110 is immersed in a medium of unity refractive index, into which light-emitting device 100 emits through spherical exit surface 115 of lens 110. [Note that with no loss of generality, all dimensions and expressions described herein can be scaled correctly, with the light-emitting device immersed in a medium of refractive index $n_0$ instead of unity, simply by replacing the value n in those dimensions and expressions with the ratio $(n/n_0)$.] A light source, luminous element 120, that emits light in the positive z direction is embedded in the material of lens 110. Such a light source can have, for example, an electroluminescent surface, or have an emitting surface including a phosphor that is optically pumped from a separate pump light source. Only the emitting surface of the luminous element is shown for simplicity; as discussed later, there may be other components of the luminous element that are necessary for its operation but that need not be optically interfaced directly to lens 110 and thus are not necessary to show in order to explain the principle of operation of light-emitting device 100. Luminous element 120 has maximum radial extent r as measured along a normal to the optical axis 140. The emitting surface of luminous element 120 in this embodiment is shaped as a portion of a sphere, and arranged to lie on a notional sphere 125 of radius R/n (or $Rn_0/n$ if lens 110 is immersed in a medium of index $n_0$), centered on the same center of curvature 150 within lens 110, and centered on optical axis 140 on the negative-z side of notional sphere 125 opposite vertex 146 of lens 110, which vertex is located on optical axis 140 at the greatest positive-z extent of lens 110. Henceforth, notional sphere 125 shall sometimes be referred to as "the R/n sphere." For purposes of this discussion, FIG. 1 and similar drawings depict light-emitting devices with axial (infinite-fold rotational) symmetry about optical axis 140, such that the emitting surface of luminous element 120 is envisioned to have a circular edge 126, but the emitting surface can be shaped in ways other than circular, such as square or rectangular, so long as the maximum radial extent to the corners is equal to r, and the corners lie close to the notional R/n sphere 125.

With this placement of the emitting surface of luminous element 120 lying on R/n sphere 125, all points of the emitting surface are aplanatically imaged by exit surface 115 of spherical lens 110 to form a sharp virtual image 130 of the luminous element, positioned to lie on a notional sphere 135 having radius nR (or $nR/n_0$) and having radial extent $n^2r$ as shown. In other words, virtual image 130 is formed with a lateral magnification of $n^2$ in the medium of unity index, or more precisely, $(n/n_0)^2$, if the medium outside lens 110 has refractive index $n_0$. Notional sphere 135 shall also be referred to as "the nR sphere." That image 130 is a virtual image means that light rays emitted by points on luminous element 120 appear to be emanating from corresponding points on virtual image 130, when viewed from the medium outside lens 110 and looking back into lens 110 in the negative-z direction. Aplanatic imaging means that points on virtual image 130 are imaged sharply with no spherical aberration or coma; for this configuration of spherical exit surface 115 and light source 120, the Abbe sine condition is satisfied, and all points of virtual image 130 are also imaged free of astigmatism, which is another primary aberration. In an application of the edge ray principle, points on the edge 126 of the emitting surface of luminous element 120 should be imaged to edge 136 of the virtual image substantially free of aberrations. Deviations of points on the luminous element 120 away from lying exactly on the R/n sphere 125 result in an increase in aberrations, a less-sharp virtual image, and thus some blurring of the edges of the beam pattern. The optical effects of such deviations can be quantified and comprehended in a design and/or in the presence of fabrication errors to achieve a certain acceptable level of performance. For this reason, edge 126 of luminous element 120 may be arranged to lie "approximately" rather than exactly on R/n sphere 125, since the emitting surface will be substantially aplanatically imaged with a known and limited degradation in performance from perfect construction. Small deviations in any direction from R/n sphere 125 can be tolerated within predetermined tolerances. Likewise, since light sources for illumination emit over a range of wavelengths, and practical materials for lens 110 exhibit optical dispersion such that the refractive index n is a function of wavelength, even a perfectly-fabricated device should have exactly ideal performance at only one wavelength. It should also be noted that because of spherical symmetry of the entire system, any shift of the center of luminous element 120 away from the drawn optical axis 140 (while edge 126 remains on notional sphere 125) is expected to simply redefine a new optical axis about which the far-field pattern is centered, and thus aside from pointing in a different direction, the far-field pattern performance in terms of beam divergence will be undiminished.

Figure 2:
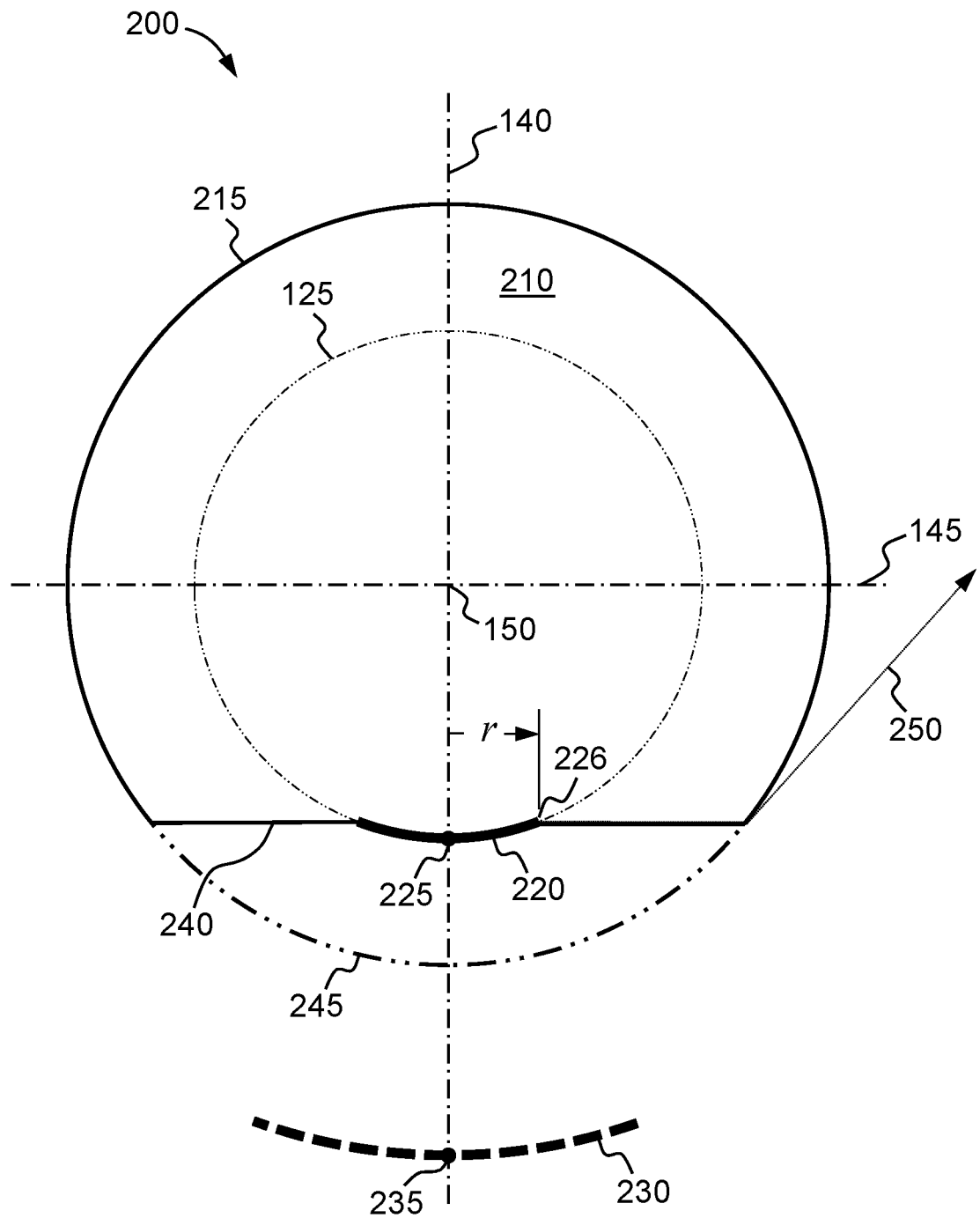
FIG. 2 is a cross-sectional view of a light-emitting device having a truncated back surface.

The far-field beam pattern of the light-emitting device of FIG. 1, for a luminous element 120 having relatively small lateral extent r, so that edge 126 lies close to optical axis 140, is Lambertian (falls off as a cosine function) out to a cutoff divergence half-angle equal to the critical angle of total internal reflection (TIR) given by $\arcsin(n_0/n)$. This cutoff occurs due to high internal reflection of rays emitted close to horizontal (nearly parallel to the x-y plane) from luminous element 120. This situation can be understood more fully with reference to FIG. 2, which shows sectional view of a light-emitting device 200 according to another embodiment, having lens 210 with exit surface 215, and luminous element 220 with edge 226, configured similarly to those in FIG. 1. Again, luminous element 220 is assumed to emit in a Lambertian pattern towards the half-space of positive z within lens 210, and it is placed on notional R/n sphere 125 so that all points of virtual image 230 are formed aplanatically. Light emitted horizontally from on-axis point 225, known as the Weierstrass point, would strike exit surface 215 exactly at the critical angle for TIR, and be imaged to corresponding on-axis point 235 in the virtual image 230. With this shallow spherical shaped emitter, edge 226 of luminous element 220 shadows horizontal rays from Weierstrass point 225, but horizontal rays from edge 226 strike exit surface 215 at nearly the critical angle. Extreme ray 250 emerges with an angle to optical axis 140 that is close to the critical angle for TIR, and appears to be emanating from near image point 235. There are no rays from luminous element 220 incident on exit surface 215 with negative z components. Thus lens 210 will operate in the same way as lens 110 in FIG. 1 even if segment 245 of the sphere below the luminous element is entirely removed or truncated. In FIG. 2 and similar drawings, portions of the lens that can be, or have been, removed or truncated are indicated by a bold phantom line, and the remaining exposed surface 240 of lens 210 will be referred to as a truncated surface 240. Annular truncated surface 240 has no primary optical function since there are essentially no direct rays from luminous element 220 incident upon it, except perhaps for stray rays that may occur due to manufacturing errors and that may be emitted from edge 226 above surface 240 with small negative-z components. Thus surface 240 need not be smooth or otherwise of optical quality, unless as a secondary consideration, for example, it is desired to implement a reflector here to redirect internal Fresnel reflections from exit surface 215 to recycle them for added efficiency.

Besides removing unnecessary lens material, saving cost and weight, truncating lens 210 as shown in FIG. 2 has the additional advantage of allowing access to the back side of luminous element 220, so that its emitting surface can be assembled or deposited onto lens 210 without requiring complete immersion in the lens material, and additional structures associated with luminous element 220, or required to operate luminous element 220, such as electrical connections, pump LEDs, can also be placed outside lens 210.

Figure 3A:
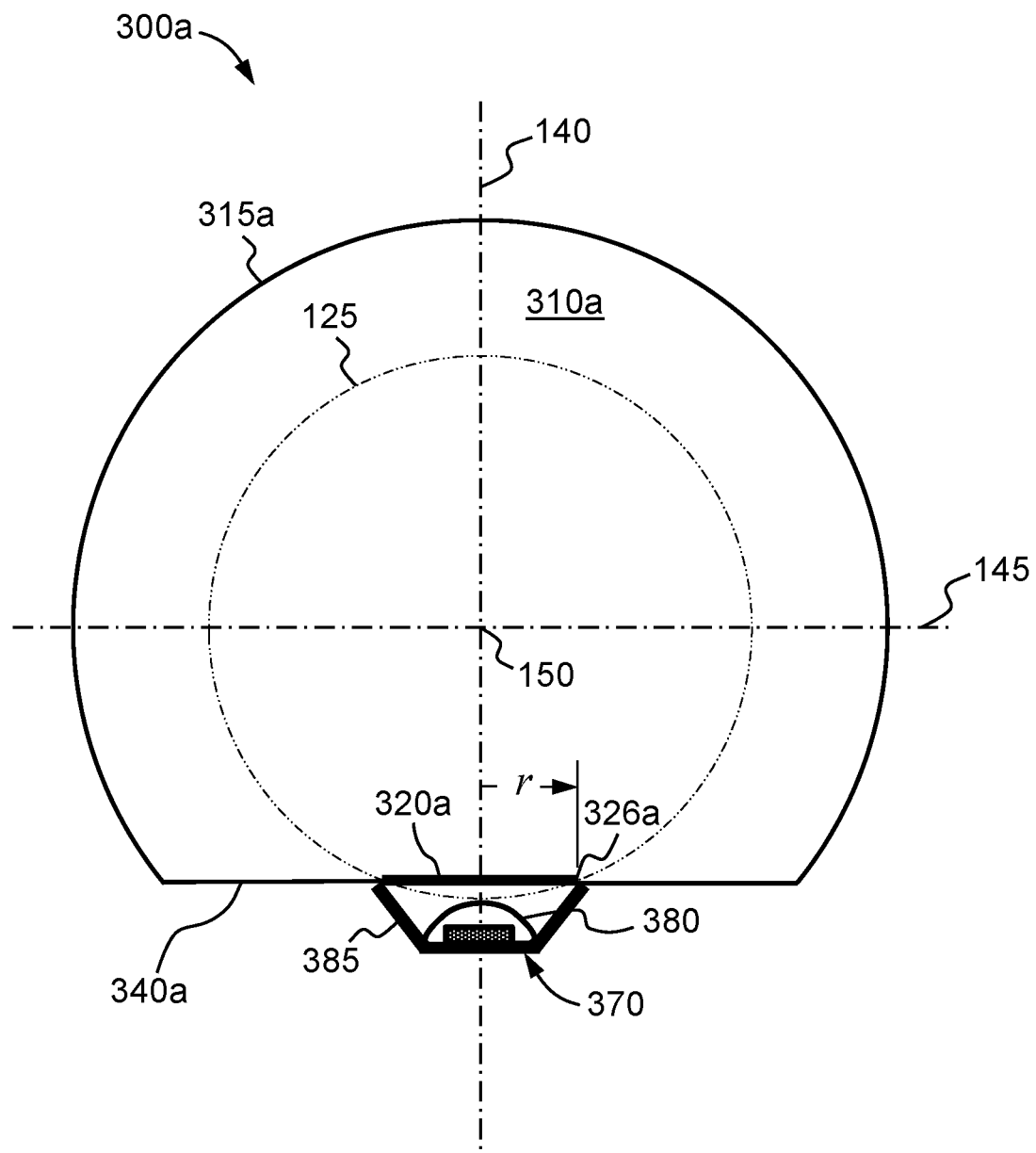
FIG. 3A is a cross-sectional view of a light-emitting device having a flat disk luminous element.
Figure 3B:
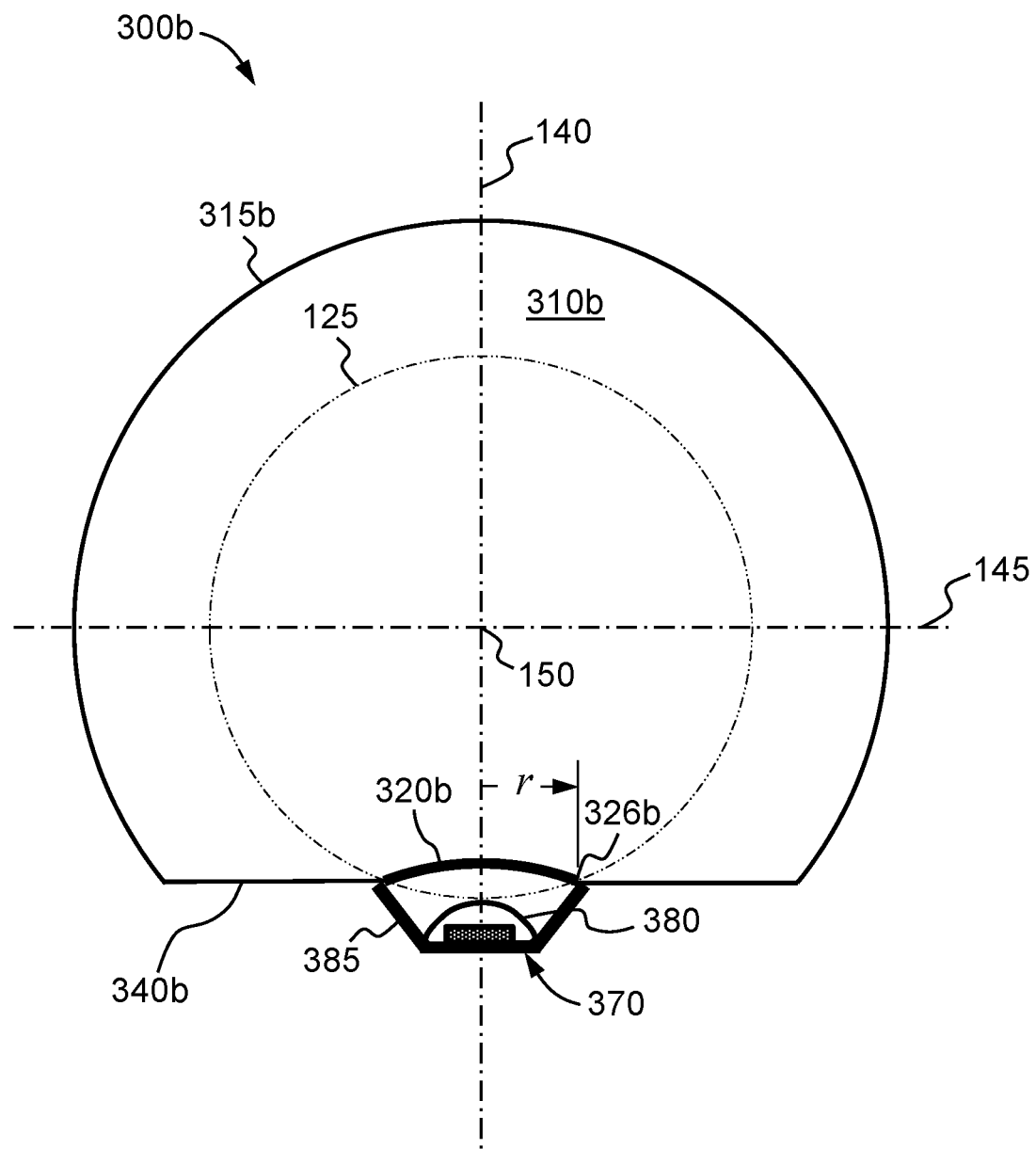
FIG. 3B is a cross-sectional view of a light-emitting device having a domed luminous element.

FIGS. 3A and 3B depict exemplary light-emitting devices in which, while the edge of the emitting surface of the luminous element lies approximately on the R/n sphere 125 in accordance with the edge ray principle, points within the edge of the emitting surface and closer to the optical axis 140 deviate from lying on the R/n sphere 125. The deviation is intentional in these examples, rather than due to fabrication error, and is due to the three-dimensional shape of the emitting surface, which unlike in FIGS. 1 and 2, does not follow the shape of the R/n sphere 125. While the edge of the emitting surface of the luminous element is placed near the R/n sphere 125, points on the emitting surface closer to the optical axis can deviate on either side of the R/n sphere and still satisfy the edge ray principle, as will be explained shortly. Thus the luminous element can be more concave (having a smaller radius of curvature) than the R/n sphere, or flatter, or convex toward the front (domed), or irregular and deviating on either side of the surface of the R/n sphere. FIG. 3A shows a light-emitting device 300a in which luminous element 320a is a flat disk such that its emitting surface is approximately planar, and FIG. 3B shows a light-emitting device 300b in which luminous element 320b is domed, having an emitting surface that is convex toward the front (i.e., toward positive z).

Specifically, FIG. 3A illustrates a sectional view of a light-emitting device 300a with lens 310a having exit surface 315a, in which truncation of lens 310a to produce a flat truncated surface 340a facilitates placement or attachment of a luminous element 320a having a flat disk shape of radial extent r. Again, annular truncated surface 340a is not necessarily of optical quality, since it has no primary optical function. But in this case, the area of lens 310a (closer to optical axis 140 than annular truncated surface 340a, with inner edge at radius r) to which luminous element 320a is optically coupled should be of optical quality, or it should be effectively index matched to the emitting surface of luminous element 320a with gel or adhesive such that roughness does not cause unwanted scattering of light emitted from luminous element 320a. Edge 326a of luminous element 320a is arranged to lie on notional sphere 125 as before. Thus the edge ray principle is applied as before, and edge 326a is aplanatically imaged by exit surface 315a. Points lying on the emitting surface of luminous element 320a at smaller radii than r from the optical axis 140 are not aplanatically imaged, since they do not lie exactly on the R/n sphere 125. But the virtual images of those points at smaller radii (not shown), although fuzzy and enlarged by aberrations, are entirely contained within the sharp circular-edged image of edge 326a. Thus no rays from inside R/n sphere 125 violate the edge ray principle, and the beam pattern does not suffer. The smaller the radial extent r of a flat disk source, the closer it approaches a point source on-axis at the Weierstrass point, and the closer all points on the disk lie to the R/n sphere 125. Smaller disks also cast narrower and sharper far-field beam patterns. As a flat disk source 320a increases in diameter, while its edge remains on the R/n sphere 125, it approaches the equatorial plane 145, and the far-field pattern changes shape and broadens, looking increasingly Lambertian except for some flattening due to internal reflection losses that redistribute the flux. Therefore, the most useful patterns from hyperhemispherical light-emitting devices such as those shown in FIGS. 1-3A and 3B are obtained with sources having relatively small radii r, for example for luminous elements whose edges lie less than half-way along the R/n sphere, so that, e.g., $r<(1/\sqrt{2})(Rn_0/n)$. All of the depicted embodiments meet this criterion. Note also that the virtual image (not shown) of a flat disk source 320*a* lies on a spherical Petzval surface that is convex toward positive z. Petzval curvature is the primary source of field curvature, so that a virtual image of a non-circular luminous element would experience some distortion in addition to the aberrations already discussed.

FIG. 3A also shows an exemplary configuration of a luminous element of a remote phosphor type in schematic fashion. Flat disk remote phosphor 320*a* is excited by a pump arrangement represented schematically by a pump source 370 including a pump LED 380, shown with a semiconductor die (typically emitting at a blue wavelength) and its own dome-shaped encapsulating lens, and a mixing chamber 385 typically including diffusely-reflecting surfaces that collect, redirect, and uniformize rays from the pump LED such that the remote phosphor disk of luminous element 320*a* is illuminated uniformly across its surface. The remote phosphor disk absorbs blue pump light and re-emits at yellow, green, and/or red wavelengths, while elastically scattering some of the blue pump light. The light that emerges from the pump disk in the generally forward direction into the lens 310*a* typically is thus a mixture of wavelengths including scattered pump light and re-emitted light from the phosphor, designed to appear white with a particular color temperature to the human eye. While this represents a typical current implementation of a luminous element such as 320*a*, others are certainly possible, including any light source that can be integrated into a light-emitting device according the present invention. (FIG. 3B also shows this type of pump arrangement, used with a domed phosphor.) In most of the remaining figures, for simplicity, representations of flat disk sources of this type generally omit and will not depict the details of the pump source 370, since the lens and reflector optics do not depend on these details, but rather only the position of the emitting surface of the luminous elements (such as 320*a*).

Besides a flat disk, a domed phosphor that is convex toward the exit surface is also possible. Such an arrangement is illustrated in FIG. 3B, which shows a light-emitting device 300*b* with a hyperhemispherical lens 310*b*, in this case with a convex domed luminous element 320*b* optically coupled to lens 310*b* and positioned such that edge 326*b* of the emitting surface of luminous element 320*b* lies approximately on R/n sphere 125. Again, luminous element 320*b* is approximately centered on optical axis 140 on the opposite (negative-z) side of R/n sphere 125 from the positive-z vertex of exit surface 315*b*. Lens 310*b* has a concave depression to accept luminous element 320*b*, which may be integrally formed into or onto lens 310*b*, or attached using index-matching material. Luminous element 320*b* can be domed more or less than is shown, and although drawn that way, need not be shaped as a portion of a sphere. Luminous element 320*b* is shown schematically, and the thickness of the line in the drawing representing it is not physically significant; a significant feature is the shape of the emitting surface. For example, the overall thickness of luminous element 320*b* need not be uniform, but a phosphor layer may be e.g. coated onto a lens-shaped substrate that is either thicker or thinner in the center than the edge, and that is transparent to the pump wavelength emitted by light-emitting diode 380. Or, in an alternative configuration of luminous element 320*b*, a convex lens-shaped transparent body can be filled with a suspension of phosphor particles distributed within it. In the case of a domed luminous element 320*b*, more care may need to be taken with truncated surface 340*b*, since some rays from luminous element 320*b* will be have a component in the backward direction (negative z component), and thus will be incident on surface 340*b*. For example, truncated surface 340*b* can be made reflective, in order to direct light back toward the positive z direction for refraction by exit surface 315*b*, and thereby increase the optical efficiency. Similarly, a light-emitting device 300*b* having a domed luminous element 320*b* may benefit from additional reflective sidewall features to be discussed next in conjunction with FIG. 4 and following figures.

Exemplary embodiments shown heretofore have depicted lenses of spherical or hyperhemispherical shape. Such shapes can present some challenges in fabrication. Furthermore, although the far-field patterns of these light-emitting devices are well-behaved, there are inefficiencies arising from the internal reflection losses experienced by a fraction of the rays incident on the exit surface at angles approaching the x-y plane, i.e., more horizontal, and, to achieve narrower beam patterns, more rays could be directed toward the optical axis. A separate reflector optically coupled to receive light from the exit surface and redirect it forward can be added to the light-emitting device, in one embodiment. But it is desirable to incorporate features into lens of the light-emitting device to control the light distribution so that fewer optical surfaces are encountered and higher efficiency is achieved. Embodiments will now be shown in which the exit surface is hemispherical or a smaller portion of a sphere, and in which additional features are incorporated so that the light-emitting device can radiate more light into a narrower range of forward angles, while ensuring that internal reflection losses are held low. While it would be possible to incorporate an optical aperture into a lens to limit the range of angles that rays pass through the lens, this approach is likely to increase losses because apertures operate by blocking rays rather than redirecting them. Thus, instead of apertures, reflecting features, either built into the lens or separate, will be provided that redirect some rays propagating at larger angles to the optical axis to exit the lens at smaller angles to the optical axis. Properly designed, these reflecting features can also be used to reduce internal reflection losses by ensuring that all rays are incident on the exit surface at angles less than a predetermined maximum incidence angle. One possible choice of a reflecting feature is, for example, a conical sidewall extending backward from the exit surface, e.g., starting at a radius from the optical axis that is a large fraction of R, at least part way toward the emitting surface of the luminous element, with a size and cone angle selected to intercept a given fraction of high-angle rays and redirect them in a more forward direction. But more control over internal reflection loss is provided by the embodiments to be described next.

Figure 4:
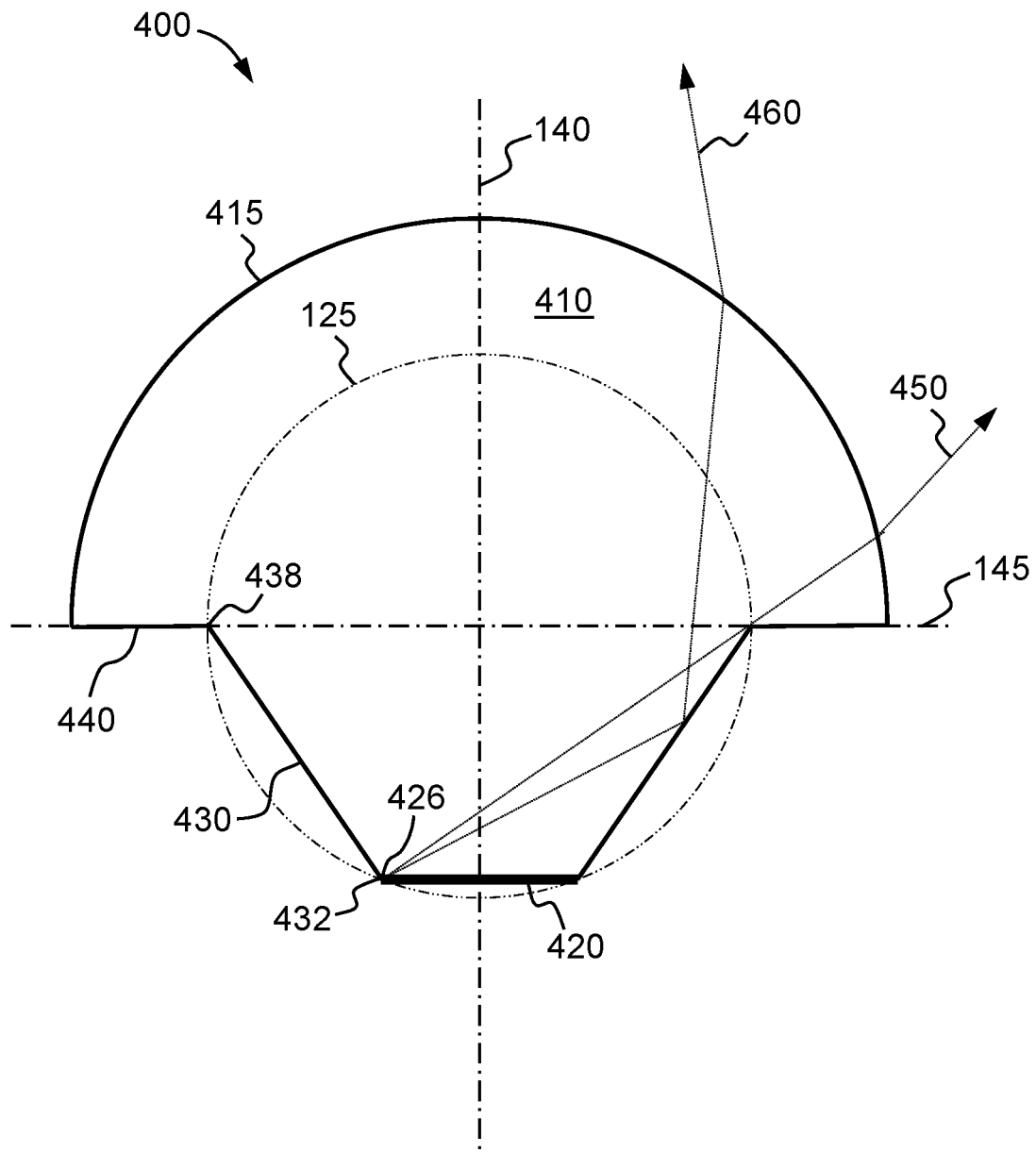
FIG. 4 is a cross-sectional view of a light-emitting device having a conical reflective sidewall.

FIG. 4 shows a cross-sectional view of a light-emitting device 400 having a lens 410 with a hemispherical exit surface 415 truncated with annular surface 440 at equatorial plane 145. Again, truncated surface 440 has no primary optical function, and it can be used, e.g., for mechanical alignment or mounting. A reflective sidewall 430 of conical shape has been added, extending from a back edge 432 close to the edge 426 of luminous element 420 to a front edge 438 in the equatorial plane. This choice of location for front edge 438 is somewhat arbitrary, and has been selected to coincide with the inner edge of flat truncated surface 440. This choice for the position of front edge 438 results in an aperture as large as possible with a hemispherical exit surface 415. Positioning front edge 438 on the R/n sphere 125 also ensures that any rays transmitted through the aperture or reflected from sidewall 430 are incident on exit surface 415 at angles that do not exceed the critical angle for TIR. This is another property of the R/n sphere 415, that any ray originating within it, or appearing to originate from within it, is necessarily incident on the exit surface 415 at radius R at an angle less than the critical angle. Example rays 450 and 460 show, respectively, a ray 450 that is incident at the greatest possible angle from the optical axis 140 from edge 426 and barely skimming the edge 438 of the conical reflector on the opposite side of optical axis 140, and ray 460 that is reflected off of the opposite conical reflective sidewall 430. It can be seen that there is still a segment of the hemispherical exit surface 415, below ray 450 and toward the equatorial plane 145 that has no rays incident on it.

Figure 5:
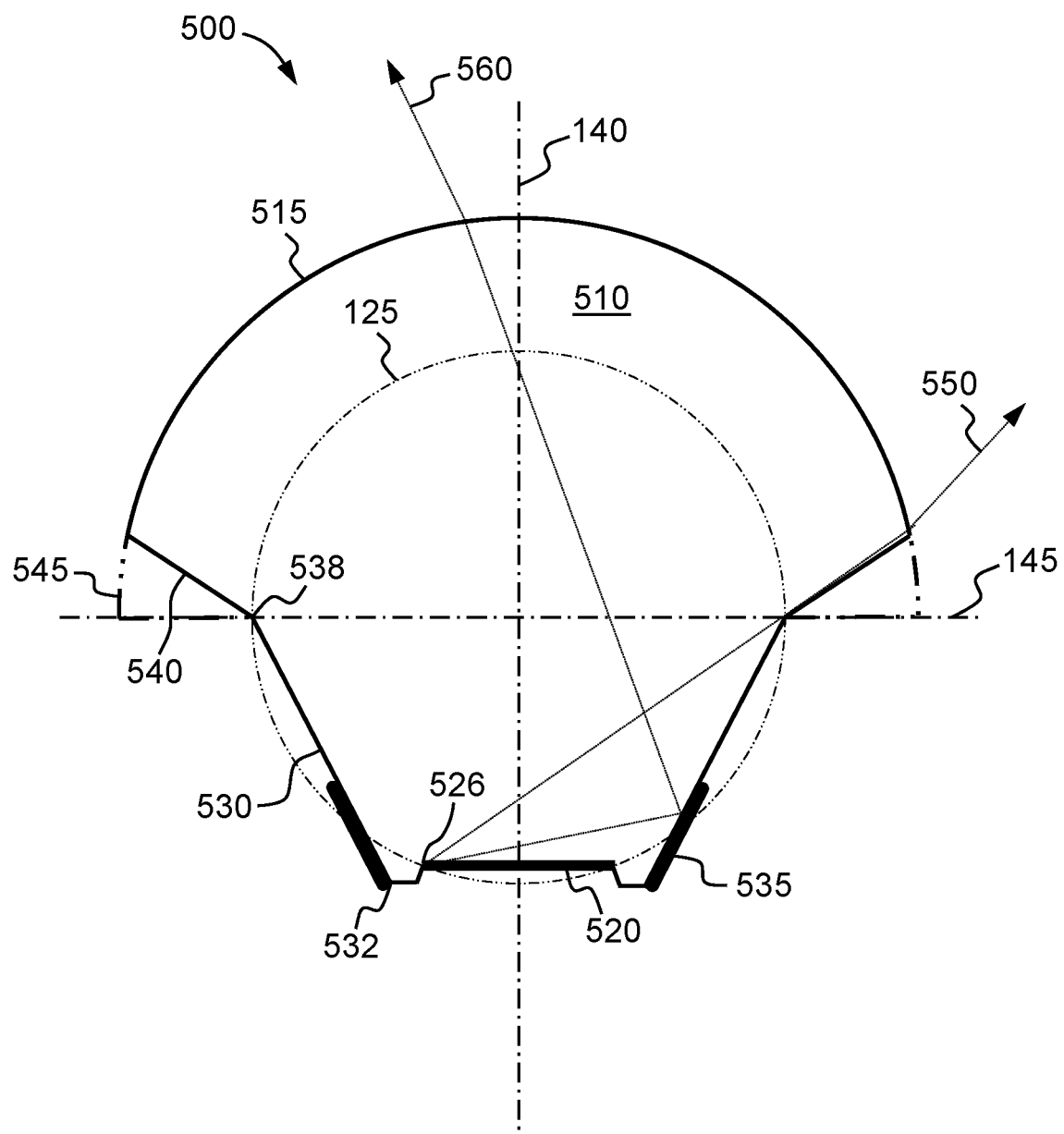
FIG. 5 is a cross-sectional view of a light-emitting device having a conical sidewall with a reflective coated area.

FIG. 5 shows a light-emitting device 500 similar to that of 400 in FIG. 4, but with some additional features. Depending on the details of refractive index and dimensions of the luminous element 520, a conical sidewall 530 may not be inherently reflective by TIR all the way down to the back edge. That is, rays such as 560 that strike sidewall 530 back toward the luminous element 520 may not be guaranteed to experience total internal reflection, because they may be incident on sidewall 530 at angles less than the critical angle. This is particularly likely for rays originating at the opposite edge 526 of luminous element 520. Thus an additional reflective area 535 such as a reflective coating on sidewall 530 or a separate reflector outside the sidewall may be necessary to guarantee reflection of these rays, at least along the back portion of the sidewall as shown in FIG. 5. Coatings 535 or additional reflectors may not be required toward front edge 538 of the sidewall 530. Lens 510 is assumed here, as in the other illustrated embodiments to be a single piece of transparent material with exit surface 515 as well as conical reflective sidewall 530 integrally formed into it. Lens 510 could be made in more than one piece and held together with index matching material between the parts to minimize reflections at the interfaces.

As mentioned before, back corner 532 need not be exactly coincident with edge 526 of luminous element 520, and it need not lie on R/n sphere 125; it just needs to be positioned such that reflective sidewall 530 can intercept all desired rays. In FIG. 5, this situation is illustrated with the back edge 532 extending below the R/n sphere 125. Luminous element 520 is positioned with its edge 526 on R/n sphere 125, and as such its emitting surface can be disposed within a recess in the back end of the lens 510. This is just one example of how the requirements of the optical configuration of the present invention can be satisfied in multiple ways while allowing variations that can, e.g., simplify fabrication or mechanical mounting.

FIG. 5 also demonstrates the truncation of lens 510 to eliminate optically unnecessary segment 545, leaving truncated surface 540, as was previously discussed in connection with FIG. 4. Ray 550 demonstrates that the most extreme rays do not strike truncated surface 540.

To further limit internal Fresnel reflection losses, instead of limiting incidence angles on the exit surface to less than the critical angle for TIR, a smaller angle can be prescribed. A convenient choice is the Brewster angle given by arctan $(n_0/n)$. This is the angle for which internal reflection losses are zero for one polarization, and are small for the other polarization. The total reflection losses are relatively flat from zero incidence to the Brewster angle, after which they increase rapidly to 100% at the critical angle. Thus the Brewster angle is a good choice for a limiting internal incidence angle. Like the R/n sphere, there exists a Brewster sphere of smaller radius $Rn_0/\sqrt{(n_0^2+n^2)}$, such that any ray originating within it, or appearing to originate from within it, is necessarily incident on the exit surface at an angle less than the Brewster angle.

Figure 6:
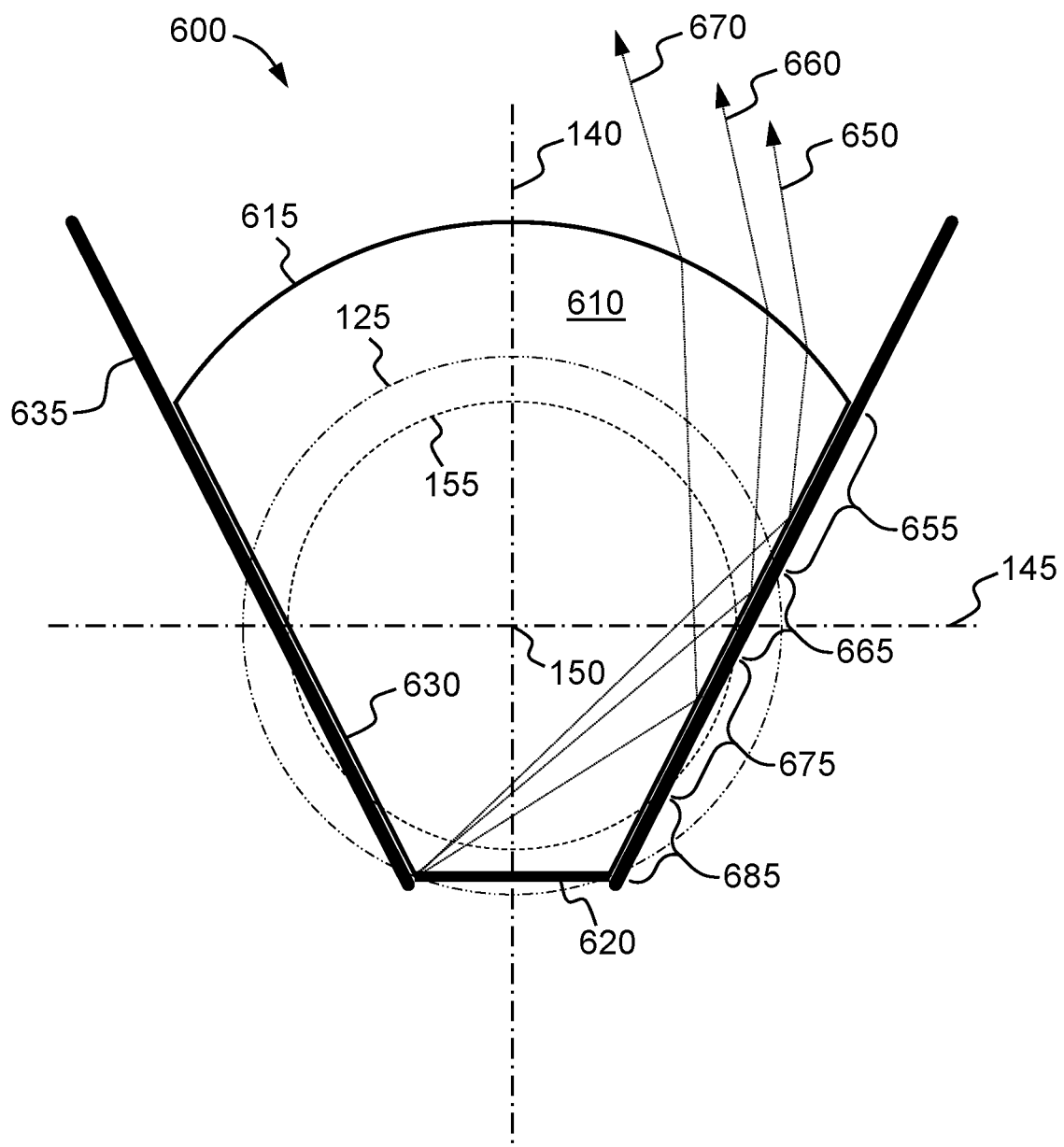
FIG. 6 is a cross-sectional view of a light-emitting device having a conical sidewall and reflector.

FIG. 6 shows a light-emitting device 600 in which a lens 610 has a conical sidewall 630 extending from the outer edge of the luminous element 620 to the exit surface 615. The conical sidewall is chosen to be at an angle such that it intersects Brewster sphere 155 in the equatorial plane 145. This sidewall may not exhibit TIR for all rays, and hence a supplementary separate reflector 635 is shown (slightly separated from the sidewall 630 for schematic purposes to indicate that it is not a coating) that can be used to reflect rays back into the lens that would otherwise escape the sidewall. Separate reflector 635 can also be constructed, as shown in FIG. 6, to extend past the exit surface 615 forward into the medium; some rays that are transmitted into the medium by exit surface 615 at large angles from the optical axis 140 can strike this reflector 635 and thereby be further directed toward the optical axis 140. In general, reflector 635 need not extend the entire length of the lens, or forward past the lens, and as one possibility, it can extend from adjacent exit surface 615 some distance toward positive z, to further direct and/or shape the light emitted from exit surface 615, even if TIR occurs farther back within the lens in light-emitting device 600, and reflector 635 is not needed toward the back. Reflector 635 can have the same shape as sidewall 630 and run parallel to sidewall 630 where they overlap along the length as shown in FIG. 6, or the shapes of reflector 635 and sidewall 630 can be different from each other. The reflector 635 is shown as a single straight cone, but can be shaped differently outside the lens 610, or reflector 635 and sidewall 630 can have matching, but varying shapes as they progress along the length of light-emitting device 600 in order to tailor the beam pattern or to guarantee various reflection angles. For example, sidewall 630 and/or reflector 635 can have different shapes along the portions labeled 655, 665, 675, and 685 in FIG. 6. Portion 685 is that part closest to luminous element 620 and extending within the R/n sphere 125. Portion 675 lies entirely within the Brewster sphere 155, so that ray 670 is guaranteed to be incident on exit surface 615 at less than the Brewster angle. Portion 665 again lies within the R/n sphere 125, and thus guarantees incidence of rays like 660 at smaller than the critical angle; but if properly shaped, or if dimensions and angles are checked to make it so, it could also guarantee incidence of ray 660 and similar rays on exit surface 615 at less than the Brewster angle. But this needs to be intentionally designed. Finally, portion 655 lies outside R/n sphere 125, and so care has to be taken to ensure that all rays like 650 hit exit surface 615 at less than the critical angle. It is possible, however, that even all these can be maintained below the Brewster angle.

Figure 7:
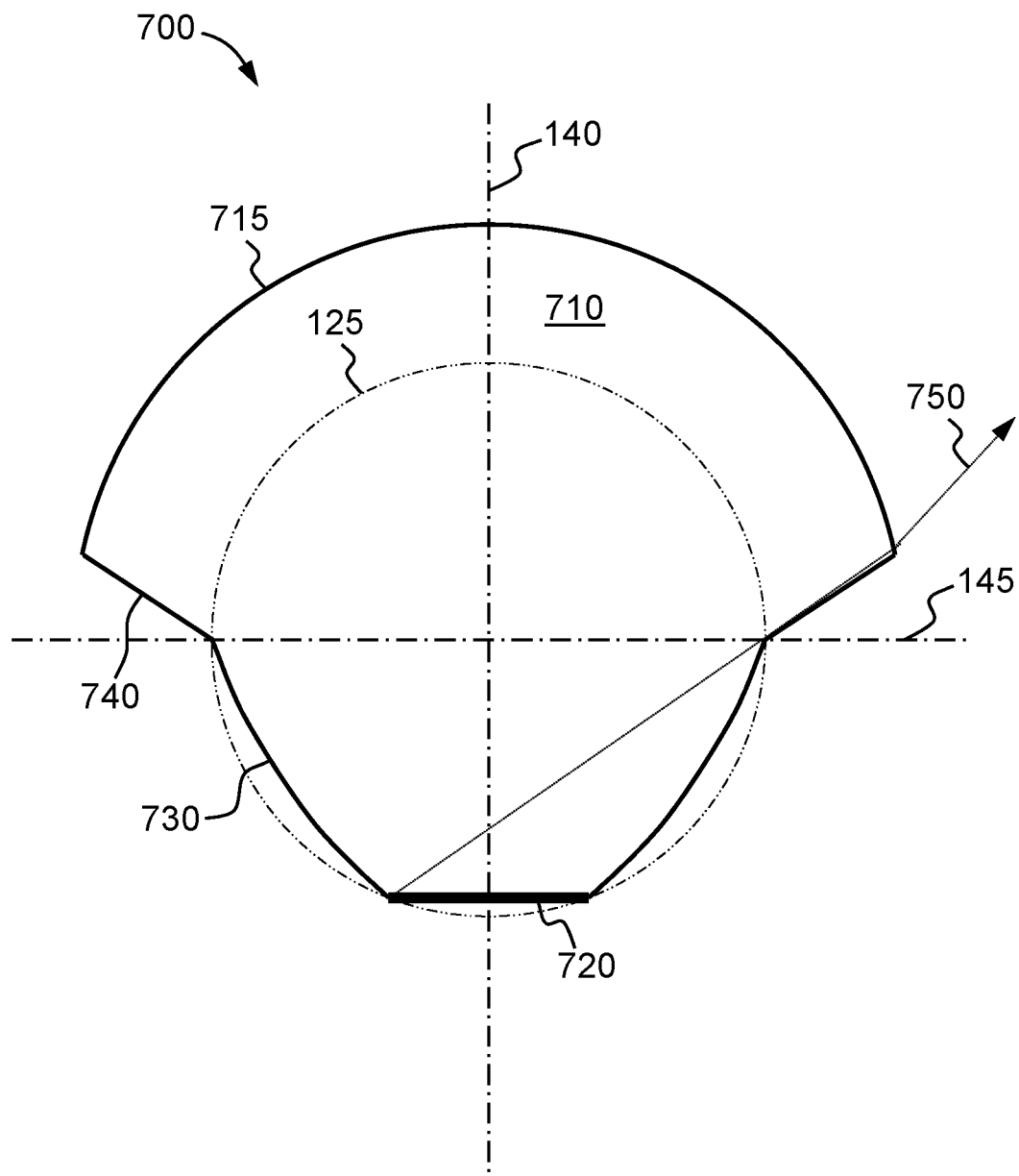
FIG. 7 is a cross-sectional view of a light-emitting device having a curved reflective sidewall.

For high efficiency and lowest losses, it is desirable to use TIR reflecting sidewalls when possible. It is known that when sidewalls are properly shaped in the form of an equiangular spiral (also called a logarithmic spiral) having a design angle of incidence that is greater than or equal to the critical angle, this criterion can be met for all rays incident on the sidewall. Such a design is illustrated in FIG. 7, which shows a light-emitting device 700 having a lens 710 with exit surface 715 and luminous element 720, where the reflecting sidewall 730 is in the shape of an equiangular spiral originating adjacent the luminous element and extending to the equatorial plane 145, terminating within the R/n sphere 125. Thus this configuration both guarantees TIR on the reflecting sidewall, and ensures the absence of TIR on exit surface 715. Surface 740 has been truncated in a manner that it does not interfere with extreme ray 750. In general, an equiangular spiral is designed to start at the outer edge of the emitting surface of luminous element 720 at radius r. The parametric equation of an equiangular spiral starting from an edge of the luminous element is s(t)=2r exp(tan g), where s is the distance to the curve from the point of origin or "unwinding," which is the edge on the opposite side of the emitting surface of luminous element 720, t is a parametric angle of unwinding, and g is the design angle of incidence, which is a constant for all rays originating from the point of unwinding and striking the spiral at each point determined by t. But depending on the details of the size of luminous element 720, the refractive index of lens 710 and/or at least the back portion of lens 710 containing the TIR portion, if it is made in more than one piece, it may be difficult or impossible to design an equiangular spiral that starts and stops at edges exactly at these locations. In those cases, several options are available, since the locations of the back and front edges are somewhat flexible as has been seen earlier.

If the refractive index is high enough, then design angle g can be made smaller and the spiral can be tightened up. This case is shown in the light-emitting device 800 depicted in FIG. 8, the TIR sidewall 830 equiangular spiral can be made narrower, e.g., beginning at the edge of luminous element 820 and terminating as shown at the equatorial plane 145 within Brewster sphere 155, guaranteeing angles of incidence of all rays such as ray 850 and ray 860 on the exit surface 815 of lens 810 of less than the Brewster angle. Again, lens 810 is truncated at surface 840 in such a manner as not to reflect rays like ray 850. However, in the interest of further narrowing the beam pattern, further truncation of the front part of the lens, e.g., with a conical sidewall 840 having a steeper angle, can be accomplished to reflect some of the large-angle rays like ray 850. This is the situation shown in FIG. 9.

Figure 8:
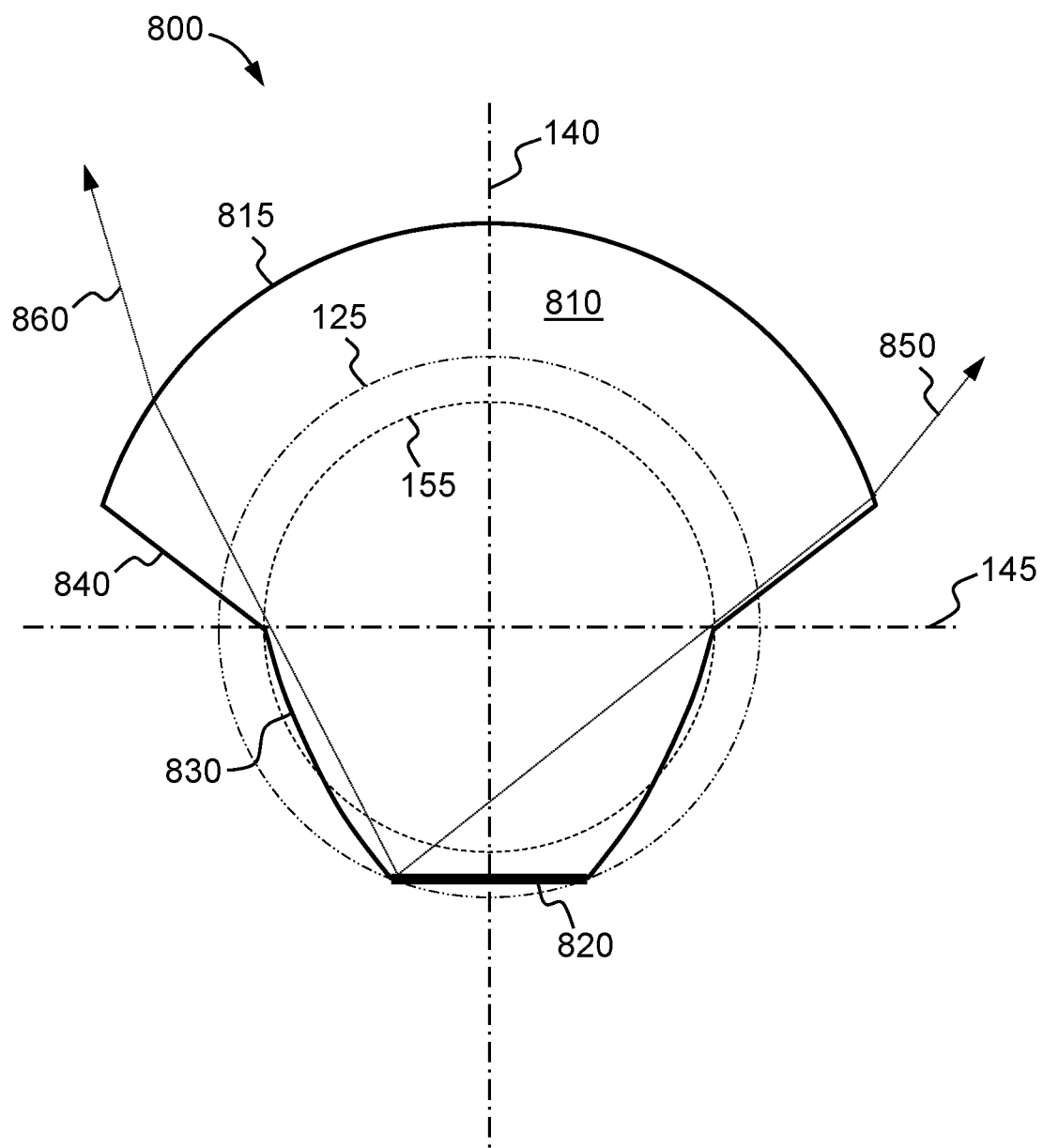
FIG. 8 is a cross-sectional view of a light-emitting device having a curved reflective sidewall whose opening terminates within a notional Brewster sphere.
Figure 9:
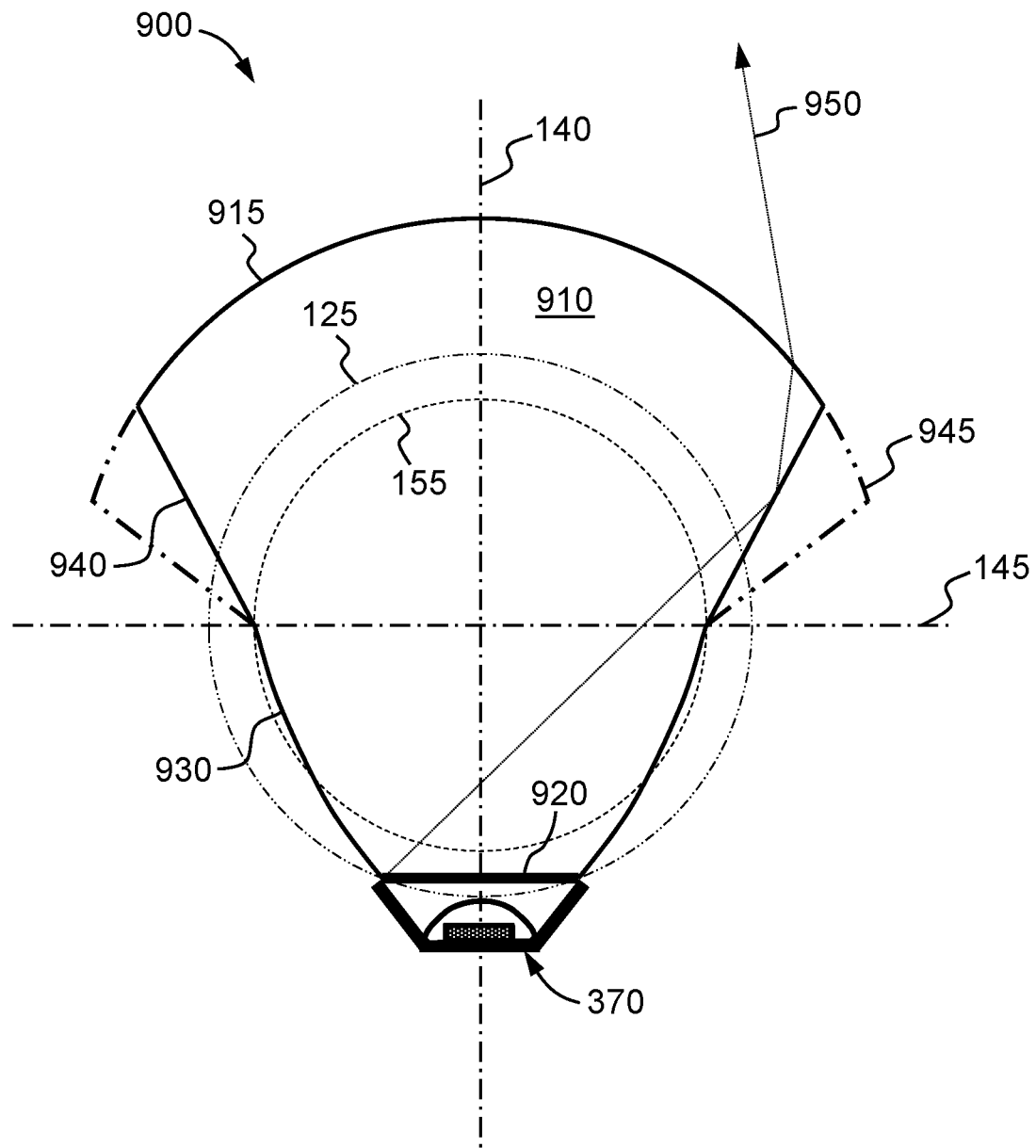
FIG. 9 is a cross-sectional view of a light-emitting device having a back curved reflective sidewall portion whose opening terminates within a notional Brewster sphere, and a front conical reflective sidewall portion.

FIG. 9 shows a light-emitting device 900 with all the features of light-emitting device 800 in FIG. 8, but with the front portion of lens 910 further truncated by removal of segment 945, leaving truncated conical surface 940. In this case, surface 940 has an optical function as a reflecting surface and should be smooth and polished, and possibly reflectively coated if all rays like ray 950 do not experience TIR. In general, it is not difficult to ensure TIR on surface 940 due to its steep angle. Reflective sidewall 930 is again shown as an equiangular spiral starting at luminous element 920 and terminating within Brewster sphere 155. Although it is not difficult to ensure TIR on truncated surface 940, care should be taken not to truncate to too narrow an angle, because beyond a certain point in narrowing the truncated surface 940, TIR on exit surface 915 from rays like 950 that reflect from sidewall 940 can occur. Light-emitting device 900 is depicted showing a luminous element 920 of remote phosphor type including its pump structure 370.

Figure 10:
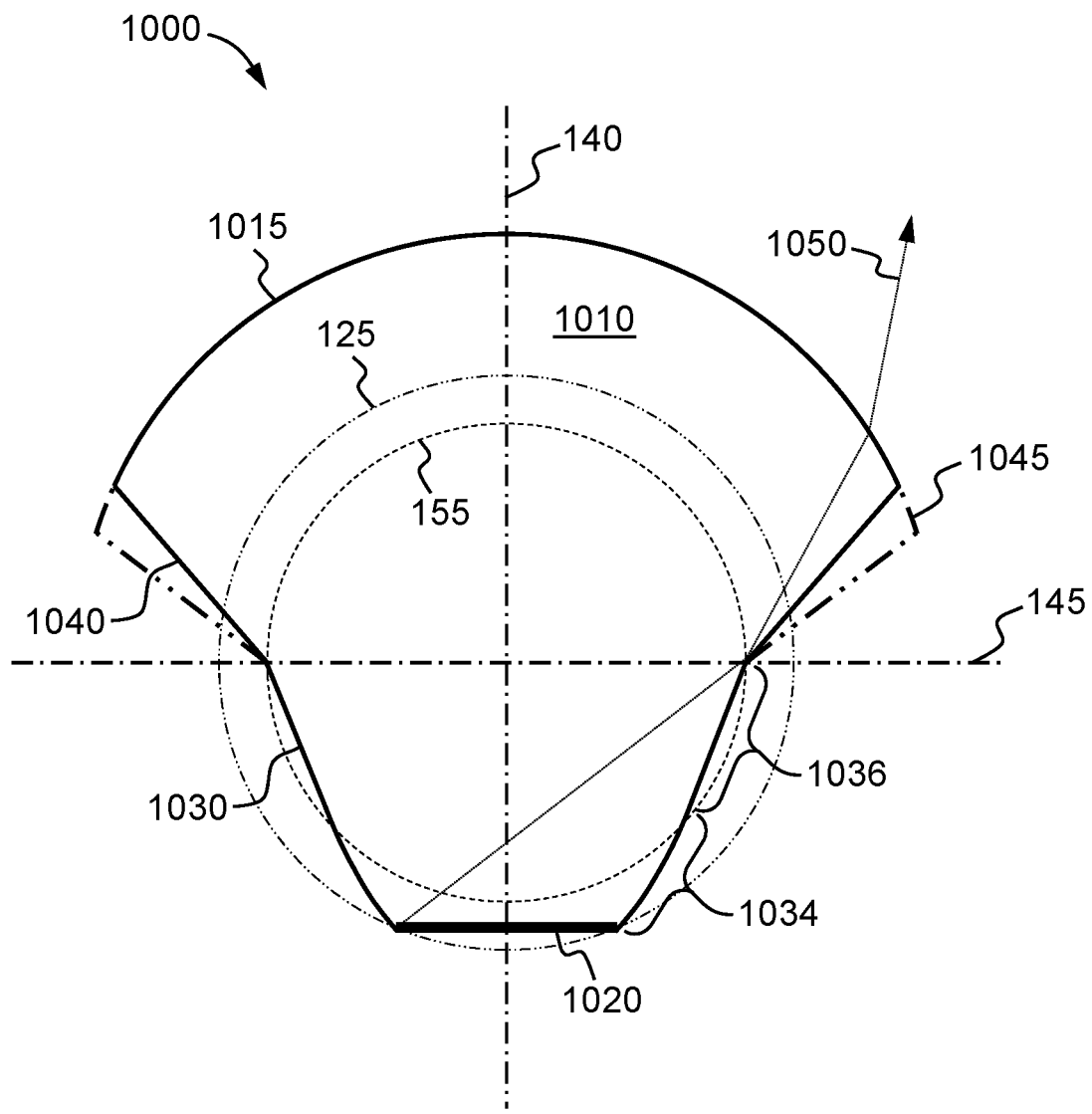
FIG. 10 is a cross-sectional view of a light-emitting device having a back reflective sidewall including multiple differently-shaped portions, whose opening terminates within a notional Brewster sphere, and a front conical reflective sidewall.
Figure 11:
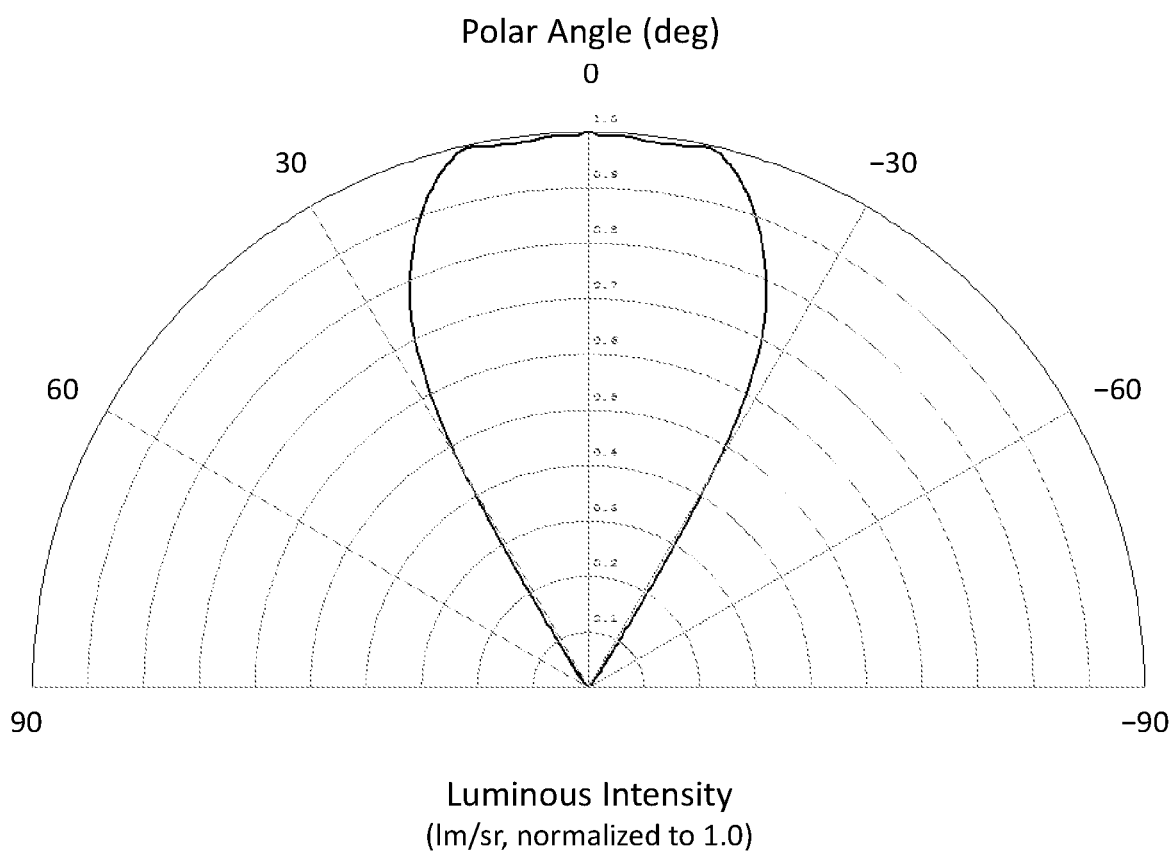
FIG. 11 is a normalized polar directivity plot of luminous intensity as a function of polar angle, showing the far-field beam pattern of the light-emitting device shown in FIG. 10.
Figure 12:
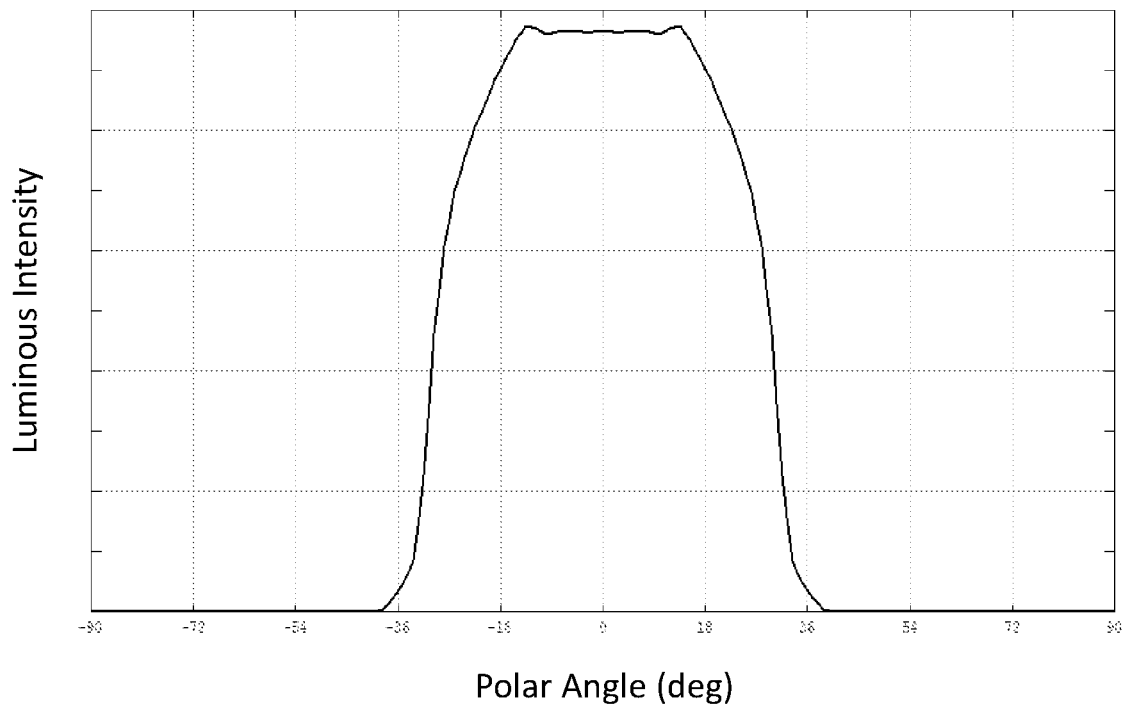
FIG. 12 is a rectangular plot of luminous intensity as a function of polar angle, also showing the far-field beam pattern of the light-emitting device shown in FIG. 10.

FIG. 10 shows a light-emitting device 1000 in which several of the foregoing concepts are all integrated. Luminous element 1020 is coupled to lens 1010 with spherical exit surface 1015 having a back reflective sidewall 1030. Sidewall 1030 includes two portions of different shape, back portion 1034 in the shape of an equiangular spiral, and front portion 1036 designed to be a straight-walled cone extending from equatorial plane 145 back to the point of tangency of the equiangular spiral. The two portions accidentally happen to join close to where sidewall 1030 crosses the Brewster sphere 155, although this is not by design. The use of two portions 1034 and 1036 of sidewall 1030 enables further shaping of the far-field beam pattern. Incorporating more than two portions of sidewall in the direction along the optical axis (the longitudinal direction) could provide even more control of the beam pattern. Furthermore, reflective sidewall 1030 could be divided into flat or curved facets in the azimuthal direction instead of, or in addition to, the longitudinal direction, in order to achieve various effects in the beam pattern, such as homogenization of the beam pattern of a nonuniform luminous element, or special effects. In addition, front segment 1045 of lens 1010 has been removed, leaving truncated surface 1040, which acts as a TIR surface to further tighten the far-field pattern. In this actual design example, the angle of the ray 1050 before reflecting off surface 1040 is just over 53 degrees. The truncated surface 1040 is set to an angle of 40.65 degrees from the optical axis to cause total internal reflection of some of the largest-angle rays like ray 1050. The resulting beam patterns are shown in FIG. 11, which shows a polar directivity plot of luminous intensity as a function of polar angle, which shows a very flat angular distribution across the center of the beam and a half-width half-maximum (HWHM) beam width of just under 30 degrees. Another plot of the same data but on rectangular axes is shown in FIG. 12, in which the "skirts" can be seen to be very steep, as is often desired in practical applications.

Additional embodiments include luminaires that include a housing to support one or more light-emitting devices. Such a luminaire may provide means for mounting and aiming the one or more light-emitting devices, and may also optionally include means for connecting electrical power to the one or more light-emitting devices. Additional optional optical elements to further direct or shape the light pattern emanating from the one or more light-emitting devices can also be incorporated into a luminaire.

Figure 13:
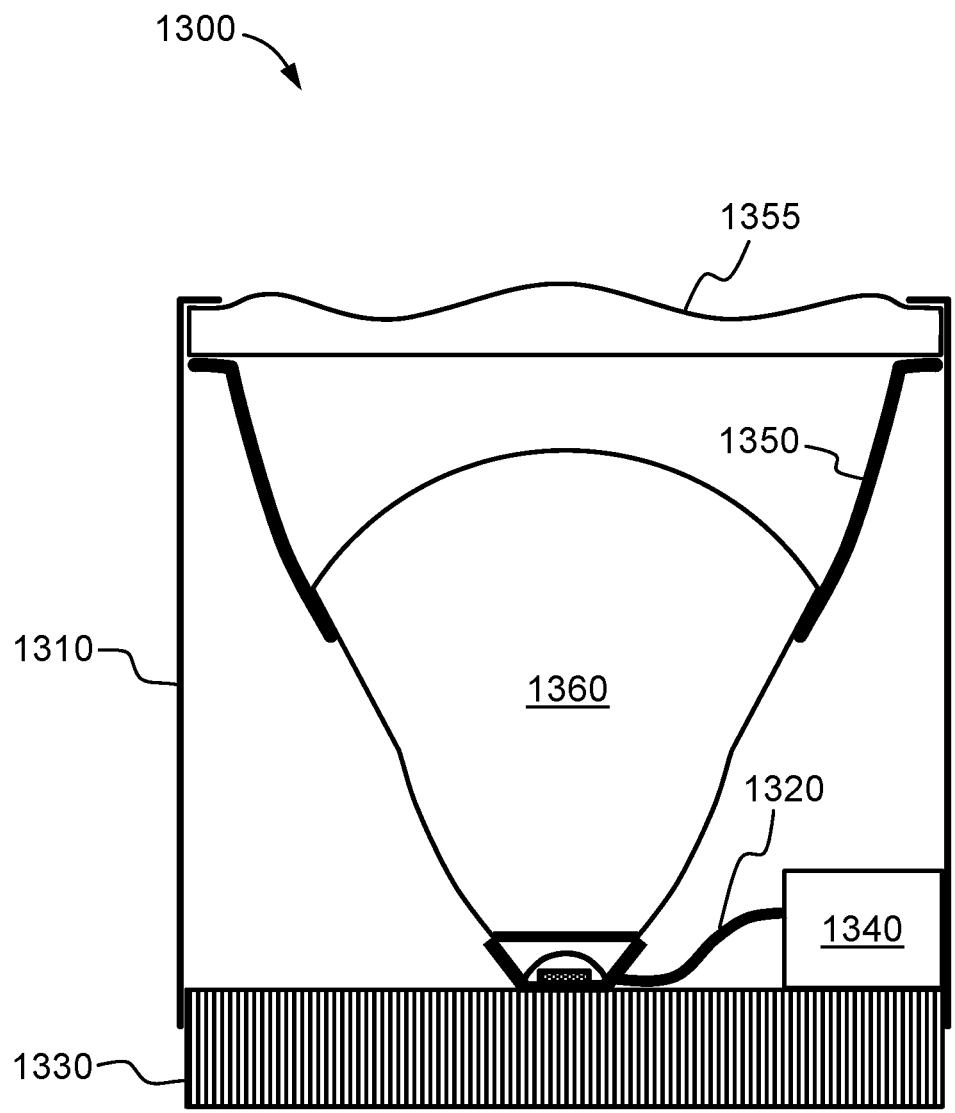
FIG. 13 is a cross-sectional view of a luminaire incorporating a light-emitting device like that of FIG. 9.

FIG. 13 shows a sectional view of an embodiment of a luminaire 1300 that also includes optional secondary optical elements. The luminaire 1300 shown in FIG. 13 includes a light-emitting device 1360 (e.g., in this case resembling light-emitting device 900 shown in FIG. 9) and a housing 1310 to support and protect the light-emitting device 1360. The housing 1310 can include structures (not shown) to facilitate mounting of the luminaire 1300. The luminaire 1300 can provide means for electrical connection of the light-emitting device 1360 to a power source outside the luminaire, for example. Electrical connection 1320 is shown schematically as a wire, but can include other connection means such as flex circuits, printed circuits, connector contacts, or other electrical connection means known in the art. In some implementations, the light-emitting device 1360 can be coupled to a cooling device 1330 such as a heat sink. The optional cooling device 1330 can be used to remove heat from the area of the light-emitting element within the light-emitting device 1360. The cooling device 1330 can be passive (including, e.g., fins for free convection), or can incorporate active cooling mechanisms such as fans or thermoelectric devices. The luminaire 1300 can also include an optional electronic module 1340. The electronic module 1340 can include additional electronics such as conversion electronics to convert mains power voltages and currents, which can be, for example, line-voltage AC, into voltages and currents of types (e.g., DC) and levels suitable for driving the light-emitting element within light-emitting device 1360. Other functions can also be incorporated into the electronics module 1340, including, but not limited to, controllers for dimming, communication with controllers outside the luminaire 1300, and sensing of ambient characteristics such as light levels, the presence of humans.

Still referring to FIG. 13, the housing 1310 of luminaire 1300 can also optionally support an additional optical element, such as a reflector 1350. The reflector 1350 can be used for direction, distribution, or shaping of the light that is output from light-emitting device 1360. For example, light emitted at large angles with respect to the axis of the luminaire 1300 and light-emitting device 1360 can be redirected into a narrower beam pattern in the far field of the luminaire 1300 by proper design of the reflector 1350.

The luminaire 1300 shown in FIG. 13 further includes an optional lens 1355 as an additional optical element coupled to the housing 1310. The lens 1355 can be configured to perform additional optical functions that alter a property of the light such as its directionality or spectrum. For example, lens 1355 can perform such functions as diffusing light to achieve a desirable pattern or reduce glare, and can incorporate additional materials or structures to accomplish these functions, such as suspended particles or surface or embedded microstructures. Lens 1355 can also include materials or structures with spectrum-altering properties to perform functions such as wavelength filtering, e.g. using absorption or diffraction. As shown in FIG. 13, some embodiments of luminaires can include both reflectors 1350 and lenses 1355.

The luminaire shown in FIG. 13 is an exemplary embodiment. Other embodiments can use different configurations of reflectors or lenses, and different relative positions within the luminaire of the light-emitting device with respect to the reflectors or lenses, as will be apparent to those skilled in the art. For example, a reflector of a different shape and oriented differently from that shown in FIG. 13 can be used to redirect light along an axis different from an axis of the light-emitting device. In some implementations, a lens can be, for example, a Fresnel lens, or a system of multiple lenses. Other functions instead of, or in addition to, directing or concentrating the light can be performed by transmissive optical elements such as lenses, or by reflective optical elements such as reflectors. For example, either lenses or reflectors can have structures incorporated within them or on their surfaces, such as small-scale roughness or microlenses, designed to diffuse or shape the light in the far field. In some embodiments, combinations of reflectors and lenses, or systems of additional reflective and/or transmissive optical elements can be used. Either transmissive or reflective optical elements can include spectrum-altering properties.

Additional alternative embodiments not pictured are also contemplated. For example, instead of a smooth spherical surface for the lens, the lens can have a stepped Fresnel surface. Lens materials can include any transparent material, such as a transparent glass or a transparent organic polymer (e.g., silicone, polycarbonate or an acrylate polymer, cyclic olefin polymers or cyclic olefin copolymers).

The luminous element can be self-luminescent, such as an electroluminescent device, or a phosphor layer pumped optically as described herein, that can be coated directly onto the lens, or coated onto a separate flat or curved/domed substrate, or glued on using index matching adhesive, or attached otherwise with index matching gel or liquid, or a phosphor suspended in a bulk polymer and multi-shot molded using a thermoplastic or thermosetting process. The luminous element can be a single element, or it can comprise multiple elements such as an array of light sources arranged according to the extents prescribed herein, e.g., with those points of the array having the greatest radial extent r arranged to lie approximately on the R/n sphere.

Certain embodiments have been described. Other embodiments are in the following claims.

What is claimed is:

1. A lens for radiating light into a medium of refractive index $n_0$, the lens comprising a medium of refractive index n, the lens having:
   an optical axis;
   an input aperture;
   a convex spherical exit aperture of radius R with a center of curvature located on the optical axis between the input aperture and the exit aperture;
   wherein at least a portion of the input aperture coincides with a notional sphere of radius $Rn_0/n$ having the same center of curvature as the convex spherical exit surface; and
   a side surface extending between the input aperture and the exit aperture, the side surface configured to direct light from the input aperture to the exit aperture.

2. The lens of claim 1, wherein an edge of the input aperture coincides with the notional sphere of radius $Rn_0/n$.

3. The lens of claim 2, wherein the input aperture is a spherical input aperture with the same center of curvature as the convex spherical exit aperture.

4. The lens of claim 2, wherein the input aperture is flat and extends perpendicular to the optical axis.

5. The lens of claim 1, wherein the input aperture is in optical contact with a phosphor and a binder.

6. The lens of claim 5, wherein the binder has the same refractive index as the medium of the lens.

7. The lens of claim 1, wherein the side surface flares with increasing distance from the input aperture.

8. The lens of claim 7, wherein the side surface is conical.

9. The lens of claim 1, wherein the side surface reflects light from the input aperture via total internal reflection.

10. The lens of claim 1 further comprising a reflective element having a reflective surface extending between the input aperture and the exit aperture.

11. The lens of claim 1, wherein the side surface has a coating.

12. The lens of claim 1, wherein the lens is axially symmetric lens about the optical axis.

13. The lens of claim 1, wherein the side surface has multiple facets.

14. The lens of claim 1 further comprising a reflector extending from the exit aperture.

15. A lens for radiating light into a medium of refractive index $n_0$, the lens comprising a medium of refractive index n, at least one section of the lens having:
   an optical axis;
   an input aperture;
   a convex circular exit aperture of radius R with a center of curvature located on the optical axis between the input aperture and the exit aperture;
   wherein at least a portion of the input aperture coincides with a notional circle of radius $Rn_0/n$ having the same center of curvature as the convex circular exit surface; and
   a side surface extending between the input aperture and the exit aperture, the side surface configured to direct light from the input aperture to the exit aperture.

* * * * *